United States Patent
Chen (10) Patent No.: US 10,950,748 B2
(45) Date of Patent: Mar. 16, 2021

(54) METHOD FOR PREVENTING CRACK EXTENSIONS DURING LIFT-OFF PROCESS

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 290 days.

(21) Appl. No.: 16/253,235

(22) Filed: Jan. 22, 2019

(65) Prior Publication Data
US 2020/0235258 A1 Jul. 23, 2020

(51) Int. Cl.
*H01L 33/00* (2010.01)
*H01L 33/12* (2010.01)

(52) U.S. Cl.
CPC .......... *H01L 33/0093* (2020.05); *H01L 33/12* (2013.01)

(58) Field of Classification Search
CPC ....................................................... H01L 33/00
See application file for complete search history.

(56) References Cited

U.S. PATENT DOCUMENTS

| | | | |
|---|---|---|---|
| 2005/0134533 A1* | 6/2005 | Sasada | G09G 3/296 345/60 |
| 2011/0018085 A1* | 1/2011 | An | H01L 31/107 257/437 |
| 2012/0104534 A1* | 5/2012 | Lee | H01L 27/1463 257/447 |

* cited by examiner

*Primary Examiner* — Marvin Payen
(74) *Attorney, Agent, or Firm* — CKC & Partners Co., LLC (57) ABSTRACT

A method for preventing crack extensions during a lift-off process is provided. The method includes forming an epitaxial layer on a wafer substrate; forming a guard trench in the epitaxial layer, wherein a depth of the guard trench in a thickness direction of the epitaxial layer is at least half of a thickness of the epitaxial layer, and a total length of the guard trench is greater than at least a quarter of a circumference of the epitaxial layer; and performing a lift-off process to separate the wafer substrate from the epitaxial layer.

10 Claims, 7 Drawing Sheets

METHOD FOR PREVENTING CRACK EXTENSIONS DURING LIFT-OFF PROCESS

BACKGROUND

Field of Invention

The present disclosure relates to a method performed before a lift-off process which can prevent crack extensions.

Description of Related Art

The statements in this section merely provide background information related to the present disclosure and do not necessarily constitute prior art.

There is a trend that a size of one device becomes smaller, especially in the semiconductor industry. In recent years said trend also becomes popular in the light-emitting display field. One of the important issues when the size of one device gradually goes down is the yield during manufacturing processes. Many efforts and resources have been poured in to enhance the yield in various ways.

SUMMARY

According to some embodiments of the present disclosure, a method for preventing crack extensions during a lift-off process is provided. The method includes forming an epitaxial layer on a wafer substrate; forming a guard trench in the epitaxial layer, in which a depth of the guard trench in a thickness direction of the epitaxial layer is at least half of a thickness of the epitaxial layer, and a total length of the guard trench is greater than at least a quarter of a total length of a circumference of the epitaxial layer; and performing a lift-off process to separate the wafer substrate from the epitaxial layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Although most of terms described in the following disclosure use singular nouns, said terms may also be plural in accordance with figures or practical applications.

Figure 1:
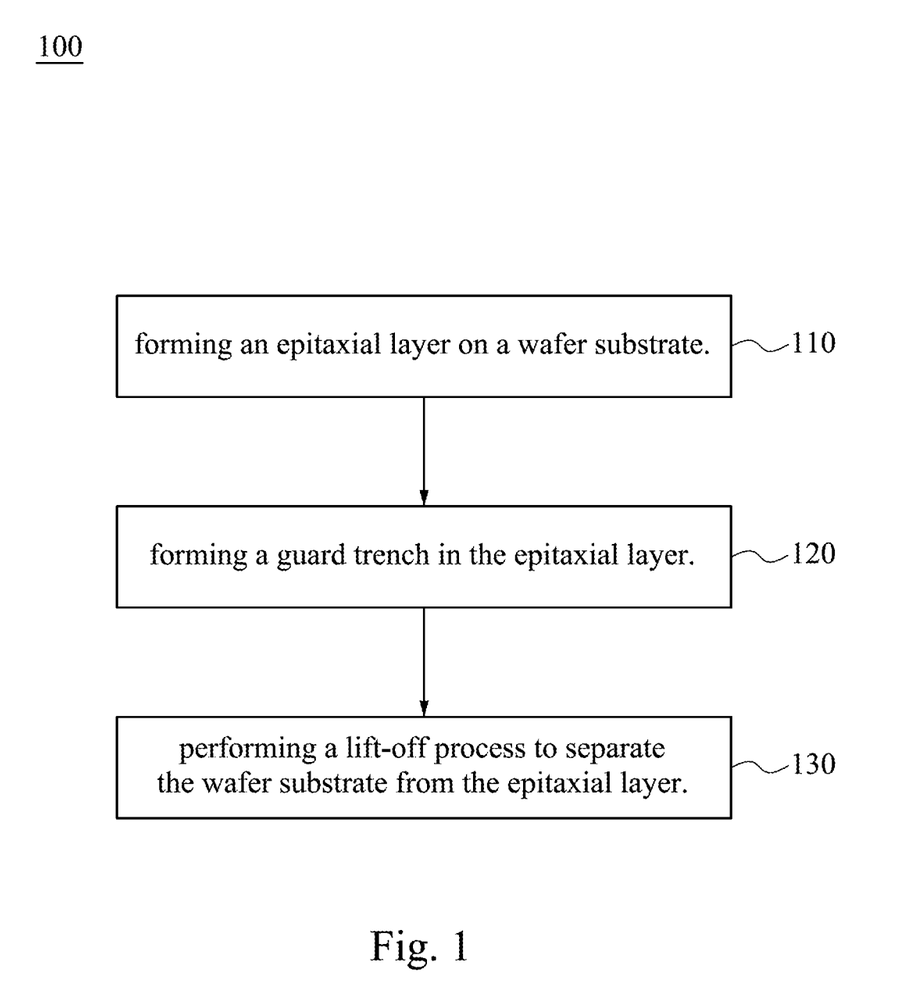
FIG. 1 is a flow chart of a method for preventing crack extensions during a lift-off process according to some embodiments of the present disclosure.
Figure 2A:
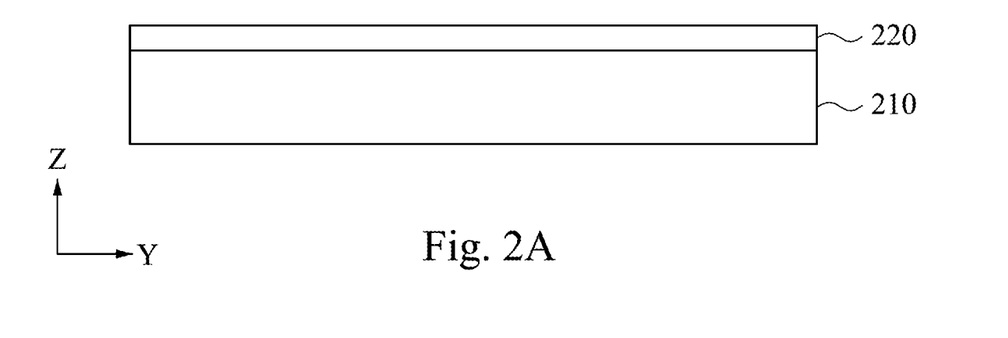
FIG. 2A is a schematic cross-sectional view of an intermediate stage of a method for preventing crack extensions during a lift-off process according to some embodiments of the present disclosure.
Figure 2B:
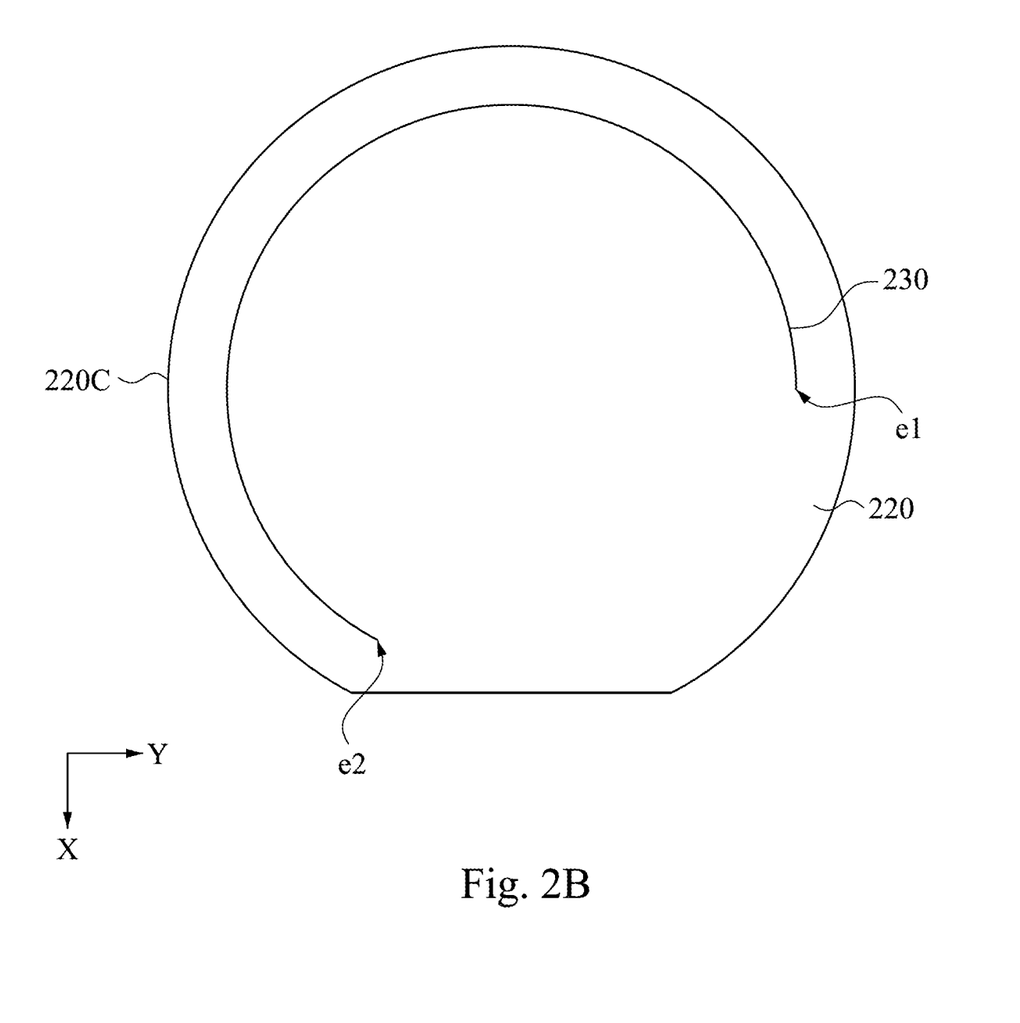
FIG. 2B is a schematic top view of an intermediate stage of a method for preventing crack extensions during a lift-off process according to some embodiments of the present disclosure.
Figure 2C:
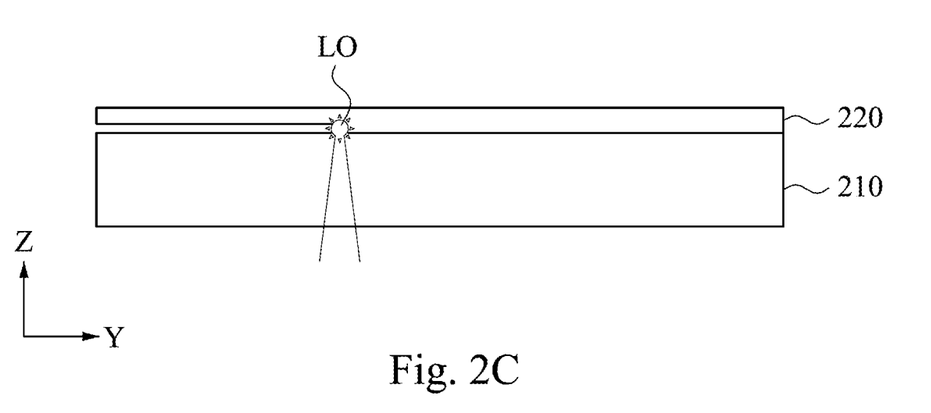
FIG. 2C is a schematic cross-sectional view of an intermediate stage of a method for preventing crack extensions during a lift-off process according to some embodiments of the present disclosure.

Reference is made to FIG. 1 and FIGS. 2A to 2C. FIG. 1 is a flow chart of a method 100 for preventing crack extensions during a lift-off process LO according to some embodiments of the present disclosure. FIG. 2A is a schematic cross-sectional view of an intermediate step of the method 100 of FIG. 1. FIG. 2B is a schematic top view of an intermediate step of the method 100 of FIG. 1. FIG. 2C is a schematic cross-sectional view of an intermediate step of the method 100 of FIG. 1. The method 100 begins with an operation 110 in which an epitaxial layer 220 is formed on a wafer substrate 210 (referred to FIG. 2A). The method 100 continues with an operation 120 in which a guard trench 230 is formed in the epitaxial layer 220 (referred to FIG. 2B). The method 100 continues with an operation 130 in which a lift-off process LO is performed to separate the wafer substrate 210 from the epitaxial layer 220 (referred to FIG. 2C).

Figure 3:
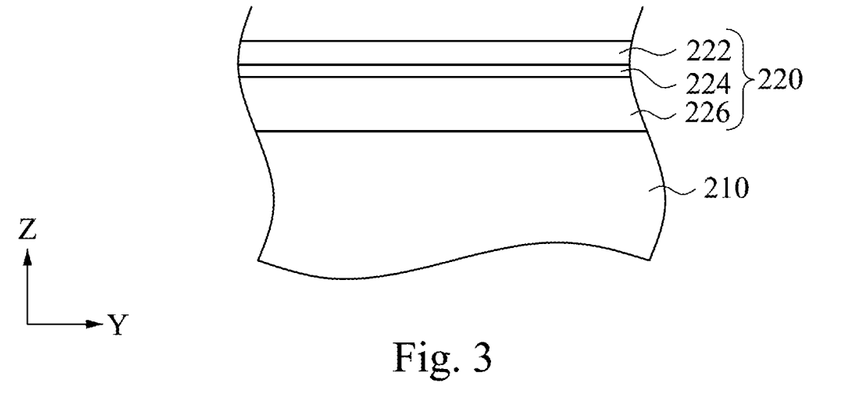
FIG. 3 is an enlarged cross-sectional view of a wafer substrate and an epitaxial layer according to some embodiments of the present disclosure.

Reference is made to FIGS. 2A and 3. FIG. 3 is an enlarged cross-sectional view of the wafer substrate 210 and the epitaxial layer 220 as shown in FIG. 1. In some embodiments, the epitaxial layer 220 includes a first type semiconductor layer 222, an active layer 224, and a second type semiconductor layer 226. The active layer 224 is in contact with the first type semiconductor layer 222. The second type semiconductor layer 226 is joined with the first type semiconductor layer 222 through the active layer 224. The first type semiconductor layer 222 can be a p-type semiconductor layer, but should not be limited thereto. The second type semiconductor layer 224 can be an n-type semiconductor layer, but should not be limited thereto. In some embodiments, the formation of the epitaxial layer 220 on the wafer substrate 210 includes forming the second type semiconductor layer 226 on the wafer substrate 210, forming the active layer 224 on the second type semiconductor layer 226, and forming the first type semiconductor layer 222 on the active layer 224. In some embodiments, the wafer substrate 210 includes one of a sapphire, a silicon, a silicon carbide (SiC), a gallium arsenide (GaAs), and a gallium nitride (GaN), but should not be limited thereto.

Figure 4:
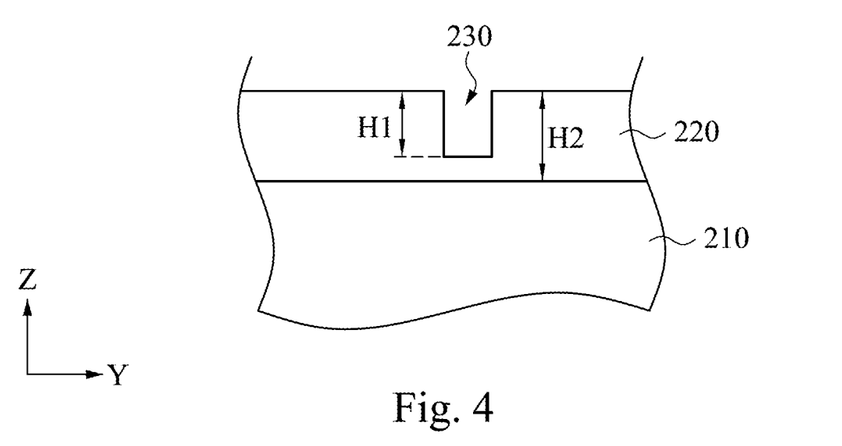
FIG. 4 is an enlarged cross-sectional view of an epitaxial layer showing a guard trench therein according to some embodiments of the present disclosure.

Reference is made to FIGS. 2B and 4. A view angle of FIG. 2B is viewed in an opposite direction of a Z direction in which the wafer substrate 210 is not visible in the figure. That is, the epitaxial layer 220 shown in FIG. 2B is lying on an X-Y plane. FIG. 4 is an enlarged cross-sectional view of the epitaxial layer 220 showing a guard trench 230 in the epitaxial layer 220 according to some embodiments of the present disclosure. The guard trench 230 is formed in a surface of the epitaxial layer 220 away from the wafer substrate 210. In some embodiments, when a guard trench 230 is formed in the epitaxial layer 220, a depth H1 of the guard trench 230 in a thickness direction (i.e. the Z direction as shown in FIG. 4) of the epitaxial layer 220 is at least half of a thickness H2 of the epitaxial layer 220. If the depth H1 is too small, cracks may extend across the guard trench 230 through a portion of the epitaxial layer 220 underneath the guard trench 230. The guard trench 230 is formed in a surface of the epitaxial layer 220 away from the wafer substrate 210. The guard trench 230 is so named due to one of its applications in which the epitaxial layer 220 is guarded by the guard trench 230 and the cracks formed during a manufacturing process (e.g., a laser lift-off process) are prevented from extending across the guard trench 230. The guard trench 230 can be formed by wet etching, dry etching, laser cutting, or mechanical cutting, but should not be limited thereto. A total length of the guard trench 230 is greater than at least a quarter of a total length of the circumference 222C of the epitaxial layer 220. Specifically, the total length is a length measured from a first end e1 to a second end e2 of the guard trench 230 along a path of the guard trench 230. Although a shape of the guard trench 230 shown in FIG. 2B is an arc, other shapes are also within the scope of the present disclosure. If the total length of the guard trench 230 is too short, cracks may still be formed due to insufficient space for sharing the stress. In some embodiments, the total length of the guard trench 230 is less than the total length of the circumference 220C of the epitaxial layer 220. If the total length of the guard trench 230 is too long, the yield of the epitaxial layer 220 which can be used to manufacture light-emitting devices after chipping may drop to an unsatisfactory situation. Notice that the "yield" herein includes a ratio between a portion of the epitaxial layer 220 which can be used to fabricate devices (e.g., light-emitting diodes) after the guard trench 230 is formed and the whole epitaxial layer 220.

Reference is made to 2C, in which the lift-off process LO is performed to separate the wafer substrate 210 from the epitaxial layer 220. In some embodiments, the lift-off process LO includes a laser lift-off process. In some other embodiments, chemical lift-off processes are also within the scope of the present disclosure. The guard trench 230 is omitted since the guard trench 230 is too narrow to be explicitly shown in FIG. 2C.

Figure 5:
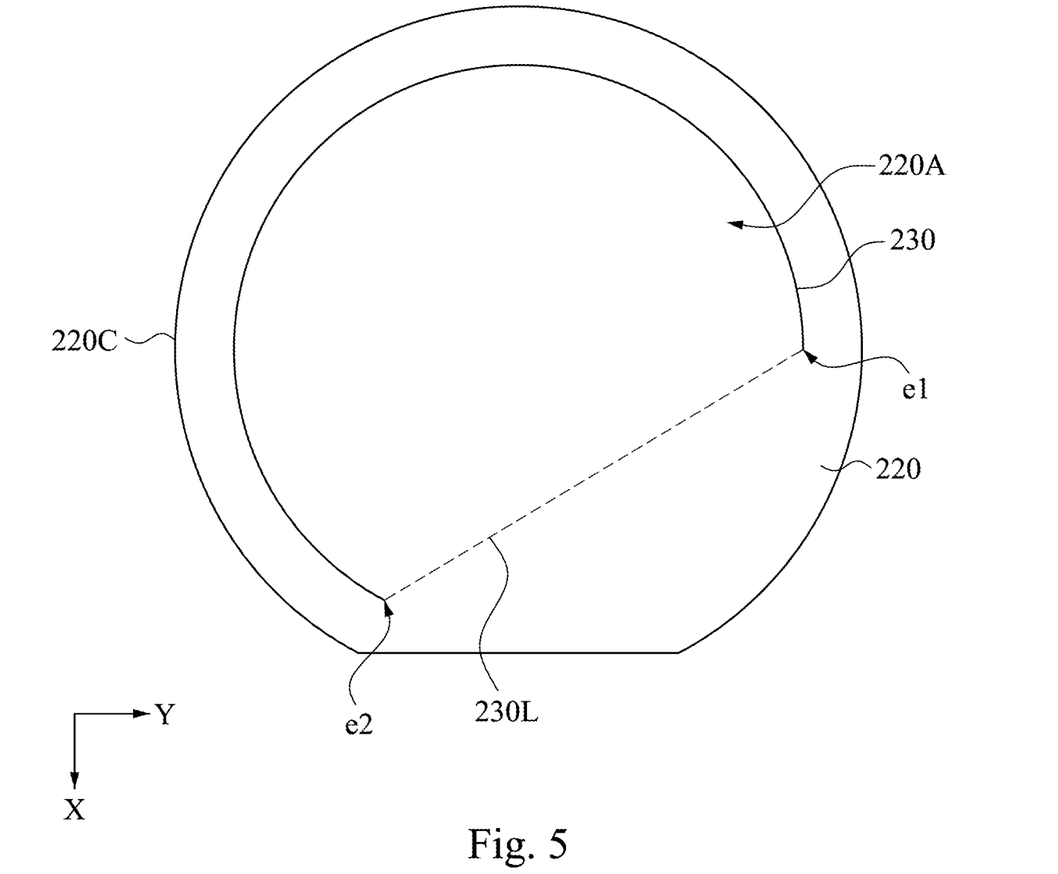
FIG. 5 is a schematic top view of an epitaxial layer according to some embodiments of the present disclosure.

Reference is made to FIG. 5. FIG. 5 is a schematic top view of the epitaxial layer 220 according to some embodiments of the present disclosure. A view angle of FIG. 5 is the same as that of FIG. 2B. In some embodiments, the surface of the epitaxial layer 220 away from the wafer substrate 210 has a partial area 220A surrounded by the guard trench 230 and at least greater than 40 percent of a total area of the surface, such that the guard trench 230 can better share a stress distributed among the epitaxial layer 220. Specifically, said partial area 220A is defined and surrounded by the guard trench 230 and a virtual straight line 230L connecting the two ends e1 and e2 of the guard trench 230. In some embodiments, cracks are easier to be formed near a circumference 220C of the epitaxial layer 220. As a result, the guard trench 230 can better prevent cracks from extending into the partial area 220A. If said partial area 220A is too small, crack extensions may be too long due to insufficient guard trench 230 for sharing the stress.

Figure 6:
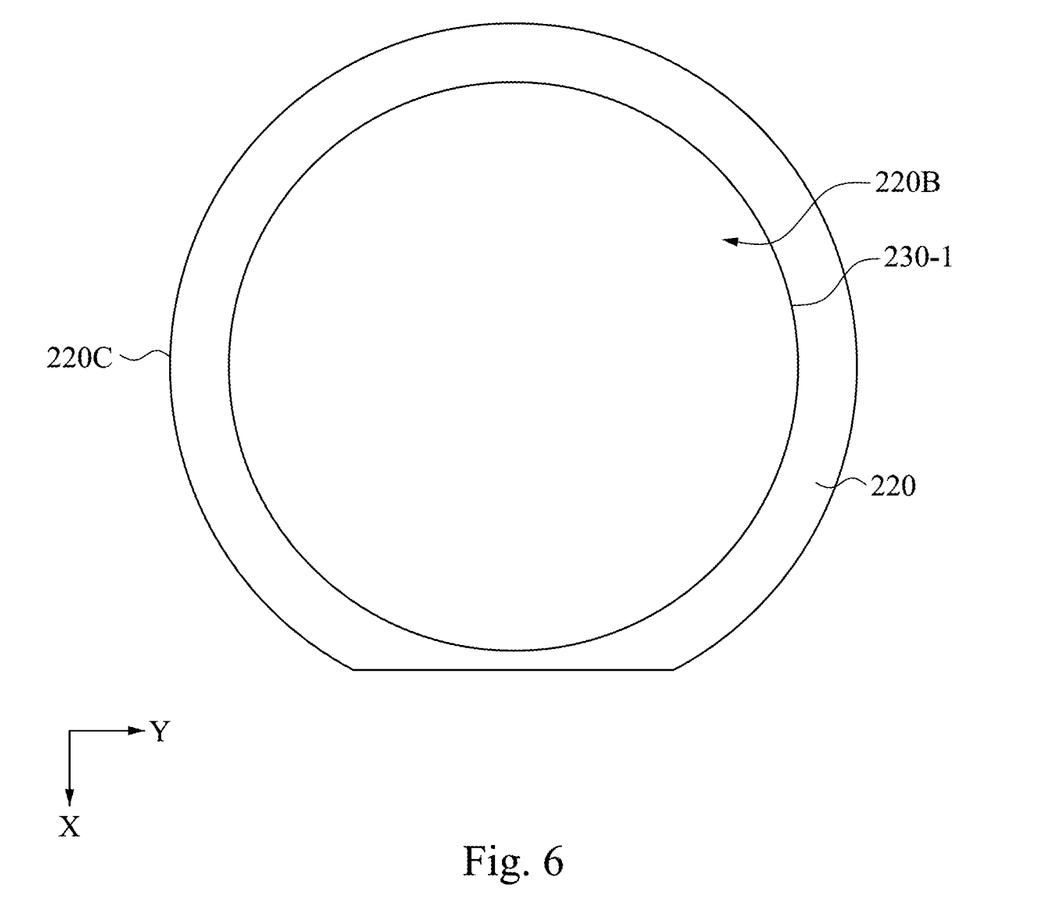
FIG. 6 is a schematic top view of an epitaxial layer according to some embodiments of the present disclosure.

Reference is made to FIG. 6. FIG. 6 is a schematic top view of the epitaxial layer 220 according to some embodiments of the present disclosure. A difference between embodiments as illustrated by FIG. 6 and the embodiments as illustrated by FIG. 5 is that a partial area 220B is enclosed by the guard trench 230-1 in the embodiments as illustrated by FIG. 6. In these embodiments, a length of the virtual straight line 230L used for defining the area is infinitesimal, or there is substantially no virtual straight line 230L.

Figure 7:
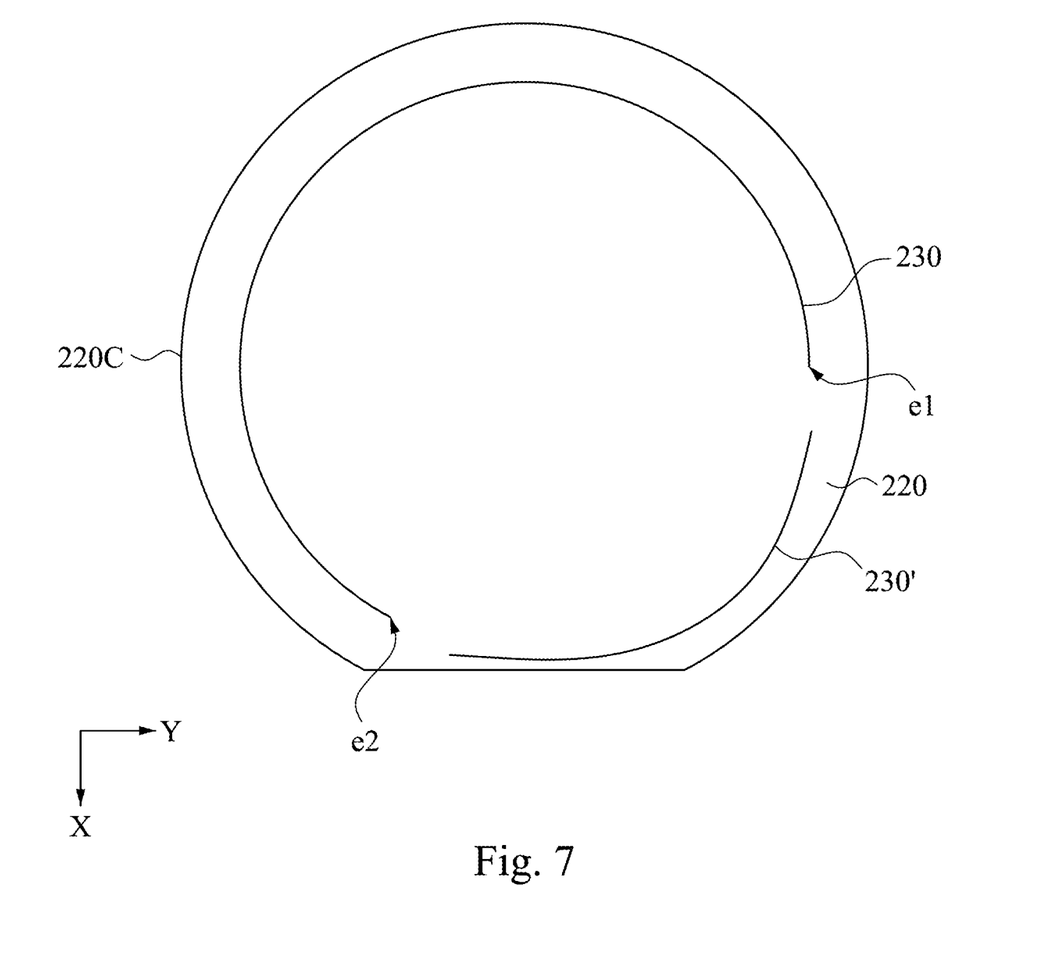
FIG. 7 is a schematic top view of an epitaxial layer according to some embodiments of the present disclosure.

Reference is made to FIG. 7. FIG. 7 is a schematic top view of the epitaxial layer 220 according to some embodiments of the present disclosure. A difference between embodiments as illustrated by FIG. 7 and the embodiments as illustrated by FIG. 2B is that an additional guard trench 230' is formed in the epitaxial layer 220. In some embodiments, a sum of the total length of the guard trench 230 and a total length of the additional guard trench 230' present in the epitaxial layer 220 is greater than at least a quarter of the total length of the circumference 220C of the epitaxial layer 220. In some embodiments, the sum of the total length of the guard trench 230 and the total length of the additional guard trench 230' present in the epitaxial layer 220 is less than the total length of the circumference 220C of the epitaxial layer 220. In some embodiments, there may be a plurality of additional guard trenches 230' present in the epitaxial layer 220.

In summary, a method for preventing crack extensions during a lift-off process is provided in some embodiments of the present disclosure in which at least one guard trench is formed to share a stress generated by the lift-off process, so as to prevent crack extensions in the epitaxial layer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for preventing crack extensions during a lift-off process, comprising:
    forming an epitaxial layer on a wafer substrate;
    forming a guard trench in the epitaxial layer, wherein a depth of the guard trench in a thickness direction of the epitaxial layer is at least half of a thickness of the epitaxial layer, and a total length of the guard trench is greater than at least a quarter of a total length of a circumference of the epitaxial layer; and
    performing a lift-off process to separate the wafer substrate from the epitaxial layer.

2. The method of claim 1, wherein the epitaxial layer comprises:
    a first type semiconductor layer;
    an active layer in contact with the first type semiconductor layer; and
    a second type semiconductor layer joined with the first type semiconductor layer through the active layer.

3. The method of claim 1, wherein the wafer substrate comprises sapphire.

4. The method of claim 1, wherein the guard trench is formed in a surface of the epitaxial layer away from the wafer substrate, and a partial area of the surface surrounded by the guard trench is at least greater than 40 percent of a total area of the surface.

5. The method of claim 4, wherein the guard trench has two ends, and said partial area is defined and surrounded by the guard trench and a virtual straight line connecting said two ends of the guard trench.

6. The method of claim 4, wherein said partial area is enclosed by the guard trench.

7. The method of claim 1, wherein the total length of the guard trench is less than the total length of the circumference of the epitaxial layer.

8. The method of claim 1, further comprising forming at least one additional guard trench in the epitaxial layer, wherein a sum of the total length of the guard trench and a total length of said at least one additional guard trench present in the epitaxial layer is greater than at least a quarter of the total length of the circumference of the epitaxial layer.

9. The method of claim 8, wherein the sum of the total length of the guard trench and the total length of said at least one additional guard trench present in the epitaxial layer is less than the total length of the circumference of the epitaxial layer.

10. The method of claim 1, wherein the lift-off process comprises a laser lift-off process.

* * * * *